United States Patent
Minemura et al.

(10) Patent No.: US 9,099,180 B2
(45) Date of Patent: Aug. 4, 2015

(54) SEMICONDUCTOR MEMORY DEVICE

(75) Inventors: Yoichi Minemura, Mie-ken (JP);
Takayuki Tsukamoto, Mie-ken (JP);
Takafumi Shimotori, Kanagawa-ken (JP); Hiroshi Kanno, Mie-ken (JP);
Tomonori Kurosawa, Kanagawa-ken (JP); Mizuki Kaneko, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 166 days.

(21) Appl. No.: 13/599,301

(22) Filed: Aug. 30, 2012

(65) Prior Publication Data
US 2013/0229853 A1 Sep. 5, 2013

(30) Foreign Application Priority Data
Nov. 18, 2011 (JP) .................. 2011-252371

(51) Int. Cl.
*G11C 11/00* (2006.01)
*G11C 13/00* (2006.01)

(52) U.S. Cl.
CPC ........ *G11C 13/0069* (2013.01); *G11C 13/0097* (2013.01); *G11C 2213/71* (2013.01); *G11C 2213/72* (2013.01)

(58) Field of Classification Search
CPC ........... G11C 13/0069; G11C 11/1675; G11C 2013/0078; G11C 2211/5648
USPC ............... 365/148, 100, 189.09, 189.14, 205, 365/189.16
See application file for complete search history.

(56) References Cited

U.S. PATENT DOCUMENTS 8,593,853 B2 * 11/2013 Katoh ........................... 365/148
2010/0046275 A1    2/2010 Hosono et al.
2011/0235394 A1 *  9/2011 Sasaki et al. ................... 365/148

FOREIGN PATENT DOCUMENTS

JP          2010-80041         4/2010

OTHER PUBLICATIONS

Office Action issued on Sep. 1, 2014 in the corresponding Japanese Patent Application No. 2011-252371 (with English Translation).

* cited by examiner

*Primary Examiner* — Richard Elms
*Assistant Examiner* — Mohammed A Bashar
(74) *Attorney, Agent, or Firm* — Oblon, McClelland, Maier & Neustadt, L.L.P.

(57) ABSTRACT

According to one embodiment, a semiconductor memory device includes a plurality of cell array blocks and a control circuit. The control circuit sets a selected bit line to have 0 volt, applies a first electric potential which is higher than 0 volt to a selected word line, applies a second electric potential which is higher than 0 volt and lower than the first electric potential to non-selected word lines other than the selected word line, applies a third electric potential which is 0 volt or more and lower than the second electric potential to a non-selected bit line adjacent to the selected bit line in an adjacent cell array block, applies the second electric potential to non-selected bit lines other than the non-selected bit line to which the third electric potential is applied, and changes a resistance status of the resistance variable film of the selected memory cell.

16 Claims, 8 Drawing Sheets

SEMICONDUCTOR MEMORY DEVICE

CROSS-REFERENCE TO RELATED APPLICATIONS

This application is based upon and claims the benefit of priority from the prior Japanese Patent Application No. 2011-252371, filed on Nov. 18, 2011; the entire contents of which are incorporated herein by reference.

FIELD

Embodiments described herein relate generally to a semiconductor memory device.

BACKGROUND

As a new non-volatile semiconductor memory device, a configuration in which word lines, bit lines, and resistance variable films interposed between the word lines and the bit lines, which serve as recording layers are stacked is suggested. By controlling an amount of a voltage which is applied to the resistance variable film, polarity, and the applying time, the resistance variable film may be switched so as to be in at least two resistance statuses having relatively different resistances.

DETAILED DESCRIPTION

Figure 1:
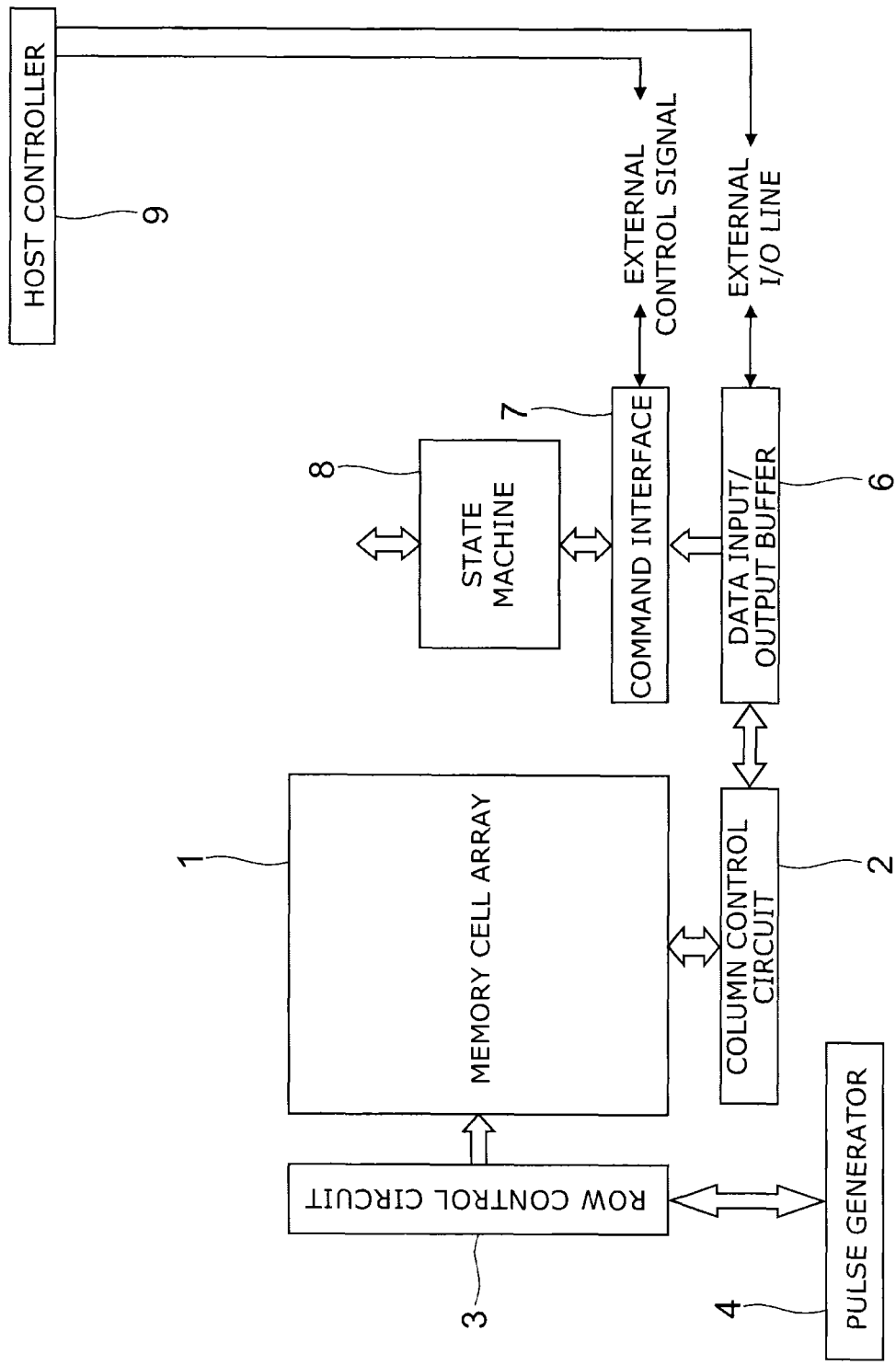
FIG. 1 is a block diagram showing a configuration of a semiconductor memory device according to an embodiment.

In general, according to one embodiment, a semiconductor memory device includes: a plurality of cell array blocks including a plurality of bit lines extending in a first direction, a plurality of word lines extending in a second direction intersecting with the first direction, and a plurality of memory cells provided between the bit lines and the word lines at cross-points of the bit lines and the word lines and including a resistance variable film, the bit lines being shared between adjacent cell array blocks in the first direction; and a control circuit. The control circuit sets a selected bit line connected to a selected memory cell selected from the plurality of memory cells to have 0 volt, applies a first electric potential which is higher than 0 volt to a selected word line connected to the selected memory cell, applies a second electric potential which is higher than 0 volt and lower than the first electric potential to non-selected word lines other than the selected word line, applies a third electric potential which is 0 volt or more and lower than the second electric potential to a non-selected bit line adjacent to the selected bit line in an adjacent cell array block that is adjacent to the selected cell array block including the selected memory cell in the first direction and shares the selected bit line with the selected cell array block, applies the second electric potential to non-selected bit lines other than the non-selected bit line to which the third electric potential is applied, and changes a resistance status of the resistance variable film of the selected memory cell.

According to another embodiment, a semiconductor memory device includes: a plurality of cell array blocks including a plurality of bit lines extending in a first direction, a plurality of word lines extending in a second direction intersecting with the first direction, and a plurality of memory cells provided between the bit lines and the word lines at cross-points of the bit lines and the word lines and including a resistance variable film, the bit lines being shared between adjacent cell array blocks in the first direction; and a control circuit. The control circuit sets a selected bit line connected to a selected memory cell selected from the plurality of memory cells to have 0 volt, applies a first electric potential which is higher than 0 volt to a selected word line connected to the selected memory cell, applies a second electric potential which is higher than 0 volt and lower than the first electric potential to non-selected word lines other than the selected word line, applies 0 volt to a non-selected bit line adjacent to the selected bit line in an adjacent cell array block that is adjacent to the selected cell array block including the selected memory cell in the first direction and shares the selected bit line with the selected cell array block, applies the second electric potential to non-selected bit lines other than the non-selected bit line to which 0 volt is applied, and changes a resistance status of the resistance variable film of the selected memory cell. The selected bit line and the non-selected bit lines adjacent to the selected bit line in the adjacent cell array block are maintained at 0 volt before and after the resistance status of the resistance variable film is changed.

According to another embodiment, a semiconductor memory device includes: a plurality of cell array blocks including a plurality of bit lines extending in a first direction, a plurality of word lines extending in a second direction intersecting with the first direction, and a plurality of memory cells provided between the bit lines and the word lines at cross-points of the bit lines and the word lines and including a resistance variable film, the word lines being shared between adjacent cell array blocks in the second direction; and a control circuit. The control circuit applies a first electric potential to a selected bit line connected to a selected memory cell selected from the plurality of memory cells, sets a selected word line connected to the selected memory cell to have 0 volt, sets non-selected bit lines other than the selected bit line to have 0 volt, sets a non-selected word line adjacent to the selected word line to have 0 volt in an adjacent cell array block that is adjacent to the selected cell array block including the selected memory cell in the second direction and shares the selected word line with the selected cell array block, applies the first electric potential to non-selected word lines other than the non-selected word line to which 0 volt is applied, and changes a resistance status of the resistance variable film of the selected memory cell.

Hereinafter, with reference to drawings, embodiments will be described. In the drawings, like components are denoted by like reference numerals.

FIG. 1 is a block diagram showing a configuration of a semiconductor memory device according to an embodiment.

A semiconductor memory device according to the embodiment includes a so-called three-dimensional cross-point type memory cell array 1. The memory cell array 1, which will be described below, includes a plurality of memory cells that are three-dimensionally arranged, a plurality of bit lines and a plurality of word lines which are stacked with the memory cells interposed between the bit lines and the word lines.

A column control circuit 2 controls an electric potential of the bit lines of the memory cell array 1 and a row control circuit 3 controls an electric potential of the word lines of the memory cell array 1. By controlling the electric potential of the bit lines and the word lines, data deleting, data writing, and data reading with respect to the memory cell are controlled.

The memory cell array 1 may be divided into units which are referred to as a plurality of cell array blocks. In this case, the column control circuit 2 and the row control circuit 3 may be provided for every cell array block or shared by the plurality of cell array blocks.

The column control circuit 2 is connected to a data input/output buffer 6. The data input/output buffer 6 is connected to an external host controller 9 via an external I/O line to receive writing data, receive a deleting command, output read data, and receive address data or command data. The data input/output buffer 6 transmits the writing data received from the host controller 9 to the column control circuit 2 and receives data read from the column control circuit 2. Further, the read data latched to the column control circuit 2 and be output to the outside through the data input/output buffer 6 and the external I/O line.

Address data for selecting a memory cell is transmitted from the outside to the column control circuit 2 or the row control circuit 3 via a state machine 8. Further, command data from the host controller 9 is transmitted to a command interface 7.

The command interface 7 receives a control signal from the host controller 9 and determines whether data input in the data input/output buffer 6 is the writing data or the command data, or the address data. If the data is the command data, the command interface 7 transmits the command data to the state machine 8 as a receiving command signal.

The state machine 8 manages the entire semiconductor memory device. In other words, the state machine 8 receives, reads, writes, and deletes commands from the host controller 9 and manages data input/output.

Further, the host controller 9 may receive status information that is managed by the state machine 8 and determine the operation result. In addition, the status information is also used to control writing and deleting operations.

The memory cell array 1 is formed on a substrate (for example, a silicon substrate). The column control circuit 2 and the row control circuit 3 may be formed on a surface of the substrate directly below the memory cell array 1. In this case, a chip area of the semiconductor memory device may be substantially equal to the area of the memory cell array 1.

A pulse generator 4 is controlled by the state machine 8. By the control of the state machine 8, the pulse generator 4 may output a pulse having a predetermined voltage at a predetermined timing. The pulse generated by the pulse generator 4 may be transmitted to a arbitrary word line selected by the row control circuit 3.

Figure 2:
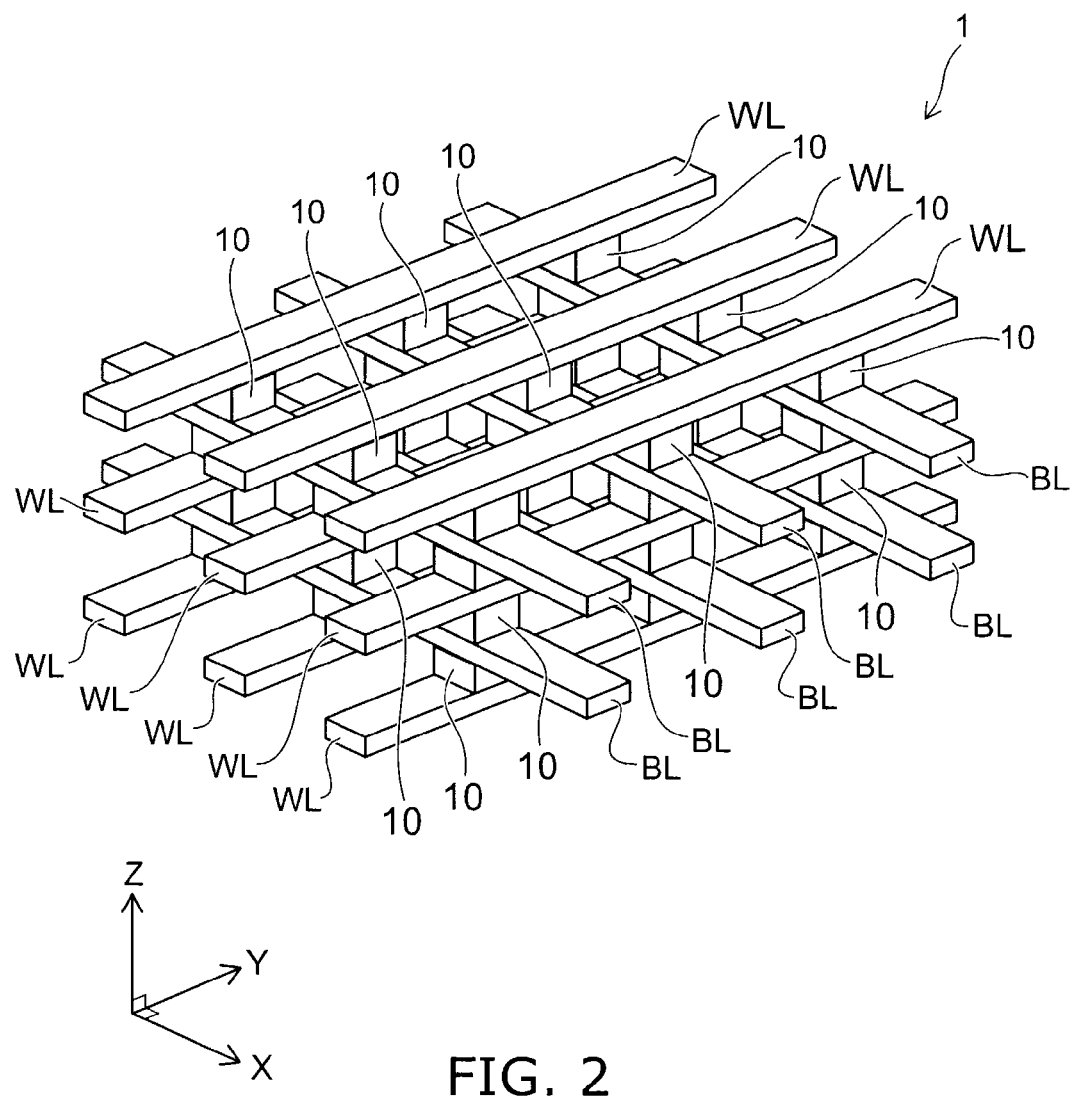
FIG. 2 is a schematic perspective view of a part of the memory cell array 1.

FIG. 2 is a schematic perspective view of a part of the memory cell array 1.

The memory cell array 1 includes a plurality of word lines WL and a plurality of bit lines BL. Further, the memory cell array 1 includes a plurality of pillar-shaped stacked bodies 10 interposed between the word lines WL and the bit lines BL.

The word lines WL and the bit lines BL are not parallel to each other in a plan view and three-dimensionally intersect with each other. The stacked bodies 10 are provided between the word lines WL and the bit lines BL at the cross points where the word lines WL and the bit lines BL intersect with each other.

The bit lines BL extend in a first direction X and the word lines WL extend in a second direction Y. The first direction X and the second direction Y intersect with each other, and for example, the first and second directions are perpendicular to each other in FIG. 2. The plurality of stacked bodies 10 are arranged in a two-dimensional direction (XY direction), for example, in a matrix, and a plurality of matrix-shaped arrays are stacked in a Z direction which is perpendicular to the XY plane. FIG. 2 shows a portion in which four arrays of, for example, 3 columns×3 rows are stacked.

Each of the word lines WL is shared between the upper and lower stacked bodies 10. Similarly, each of the bit lines BL is shared between the upper and lower stacked bodies 10. This configuration lowers the cost by reducing the number of layers.

Alternatively, a configuration in which the word line WL/the stacked body 10/the bit line BL/an interlayer insulating film/the word line WL/the stacked body 10/the bit line BL are repeated may be used. According to the configuration, the number of memory cells that are connected to one interconnect (bit line BL or word line WL) is reduced, which is suitable for high speed operation.

Figure 3:
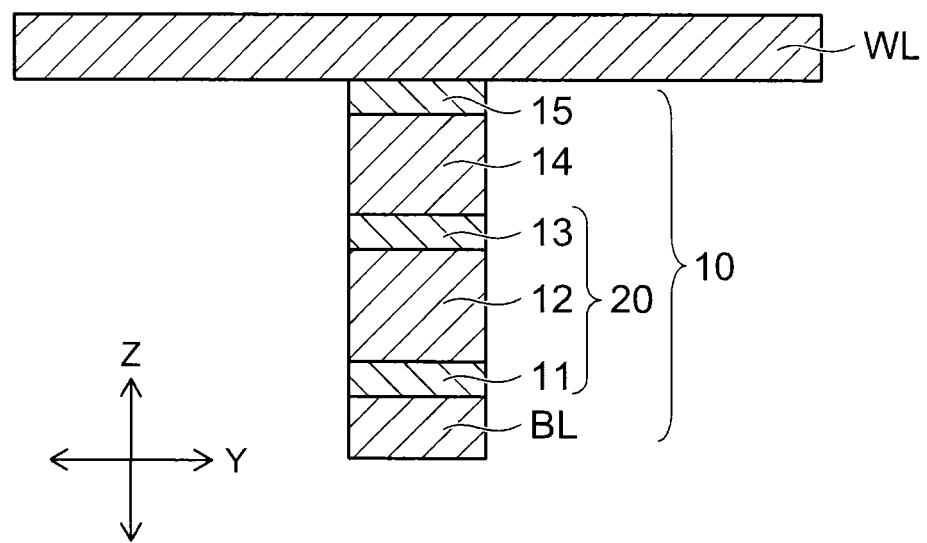
FIG. 3 shows a cross-sectional configuration of the stacked body 10.

In FIG. 3, a cross-sectional configuration of the stacked body 10 is shown. FIG. 3 corresponds to a YZ cross-section of one array in FIG. 2.

The stacked body 10 includes a memory cell 20 and a non-ohmic element 14 which are serially connected between the bit lines BL and the word lines WL and a non-ohmic element 14.

The memory cell 20 includes an upper electrode 13, a lower electrode 11, and a resistance variable film 12 that is provided between the upper electrode 13 and the lower electrode 11.

The resistance variable film 12 may be switched to be in a status having a relatively low resistance (set status) or a status having a high resistance (reset status) by a voltage, a current, heat, a chemical energy and stores non-volatile data.

As the non-ohmic element 14, for example, various diodes such as a P-N junction diode, a p-intrinsic-n (PIN) diode, a Schottky diode, or a metal-insulator-metal (MIM) element, a silicon-insulator-silicon (SIS) element may be used.

If a diode is used as the non-ohmic element 14, unipolar operation of the memory cell 20 is available. In other words, by controlling the amount of a voltage that is applied to the resistance variable film 12 or the applying time, it is possible to change the resistance status of the resistance variable film 12.

Further, if the MIM element or the SIS element is used as the non-ohmic element 14, bipolar operation of the memory cell 20 is available. In other words, by changing a polarity of a voltage that is applied to the resistance variable film 12, it is possible to change the resistance status of the resistance variable film 12.

The lower electrode 11 and the upper electrode 13 of the memory cell 20 may function as a barrier metal or an adhesion layer and for example, Pt, Au, Ag, TiAlN, SrRuO, Ru, RuN, Ir, Co, Ti, TiN, TaN, LaNiO, Al, PtIrOx, PtRhOx, Rh, or TaAlN may be used. Further, a layer 15 provided between the non-ohmic element 14 and the word lines WL may function as a barrier metal or an adhesion layer and for example, Ti or TiN may be used.

For the bit lines BL and the word lines WL, a material having good heat resistance and a low resistance is desirable for example, W, WSi, NiSi, or CoSi may be used.

The resistance variable film 12 may be electrically switched to be in at least two statuses having relatively different resistances. The status having a relatively low resistance is a set status and the status having a higher resistance than the set status is a reset status.

If a reset voltage is applied to the resistance variable film 12 which is in a low resistance state (set status), the resistance variable film 12 may be switched to be in a high resistance state (reset status). If a set voltage which is higher than the reset voltage or has a different polarity from the reset voltage is applied to the resistance variable film 12 which is in a high resistance state (reset status), the resistance variable film 12 may be switched to be in a low resistance state (set status).

Figure 4:
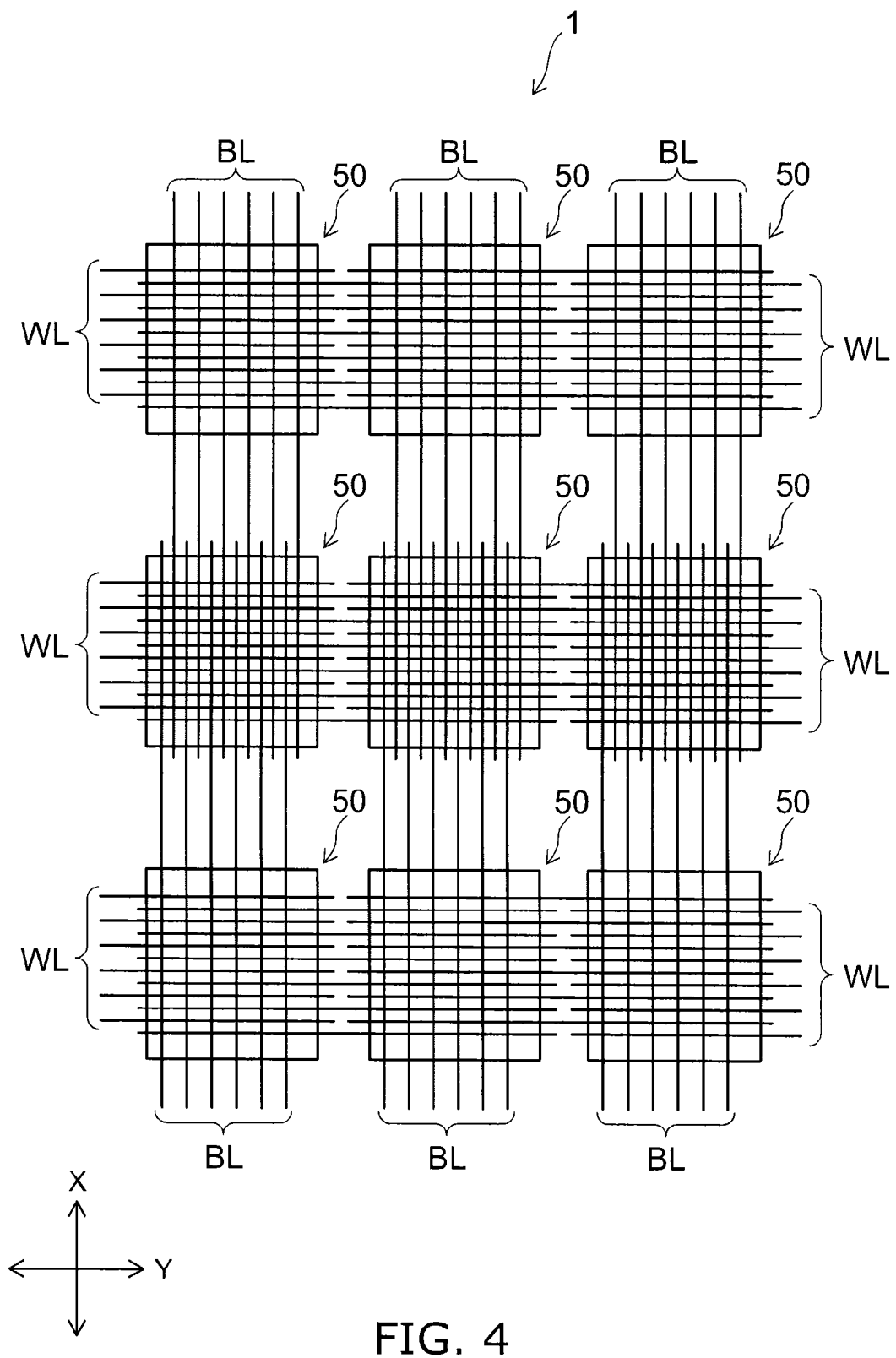
FIG. 4 is a schematic plan view of a part of any one layer in the memory cell array 1.

FIG. 4 is a schematic plan view of a part of any one layer in the memory cell array 1.

Each of layers of the memory cell array 1 is divided into a plurality of cell array blocks 50. The plurality of cell array blocks 50 are arranged in a matrix in a first direction X that is a direction in which the bit lines BL extend and a second direction Y that is a direction in which the word lines WL extend.

The bit lines BL do not connect all cell array blocks 50 arranged in the first direction X. Similarly, the word lines WL do not connect all cell array blocks 50 arranged in the second direction Y. By doing this, it is possible to suppress the increase in lengths of the interconnects and also suppress voltage drop (IR drop) in the bit lines BL or the word lines WL or leakage current from non-selected memory cells.

However, the bit lines BL are not decoupled in the unit of each of the cell array blocks 50, but are shared between the adjacent cell array blocks in the first direction X, for example, between two cell array blocks 50. Similarly, the word lines WL are not decoupled in the unit of each of the cell array blocks 50, but are shared between the adjacent cell array blocks in the second direction Y, for example, between two cell array blocks 50. Therefore, it is possible to suppress the increase in the chip area.

In the first direction X of FIG. 4, for example, a bit line BL shared between two upper cell array blocks 50 and a bit line BL shared between two lower cell array blocks 50 are alternately arranged in the second direction Y.

In the second direction Y of FIG. 4, for example, a word line WL shared between two left cell array blocks 50 and a word line WL shared between two right cell array blocks 50 are alternately arranged in the first direction X.

Next, for example, a writing operation (set operation) of the memory cell will be described.

A memory cell which is an operating (writing) target is referred to as a selected memory cell (simply referred to as a selected cell) and memory cells other than the selected cell are referred to as non-selected memory cells (simply referred to as non-selected cells). Further, a bit line BL that is connected to the selected cell is referred to as a selected bit line, and bit lines BL other than the selected bit line are referred to as non-selected bit lines. A word line WL that is connected to the selected cell is referred to as a selected word line, and word lines WL other than the selected word line are referred to as non-selected word lines.

In the operation which will be described below, the electric potentials of the selected bit line and the non-selected bit lines are controlled by the column control circuit 2 shown in FIG. 1 and the electric potentials of the selected word line and the non-selected word lines are controlled by the row control circuit 3 shown in FIG. 1.

First Embodiment

Figure 5:
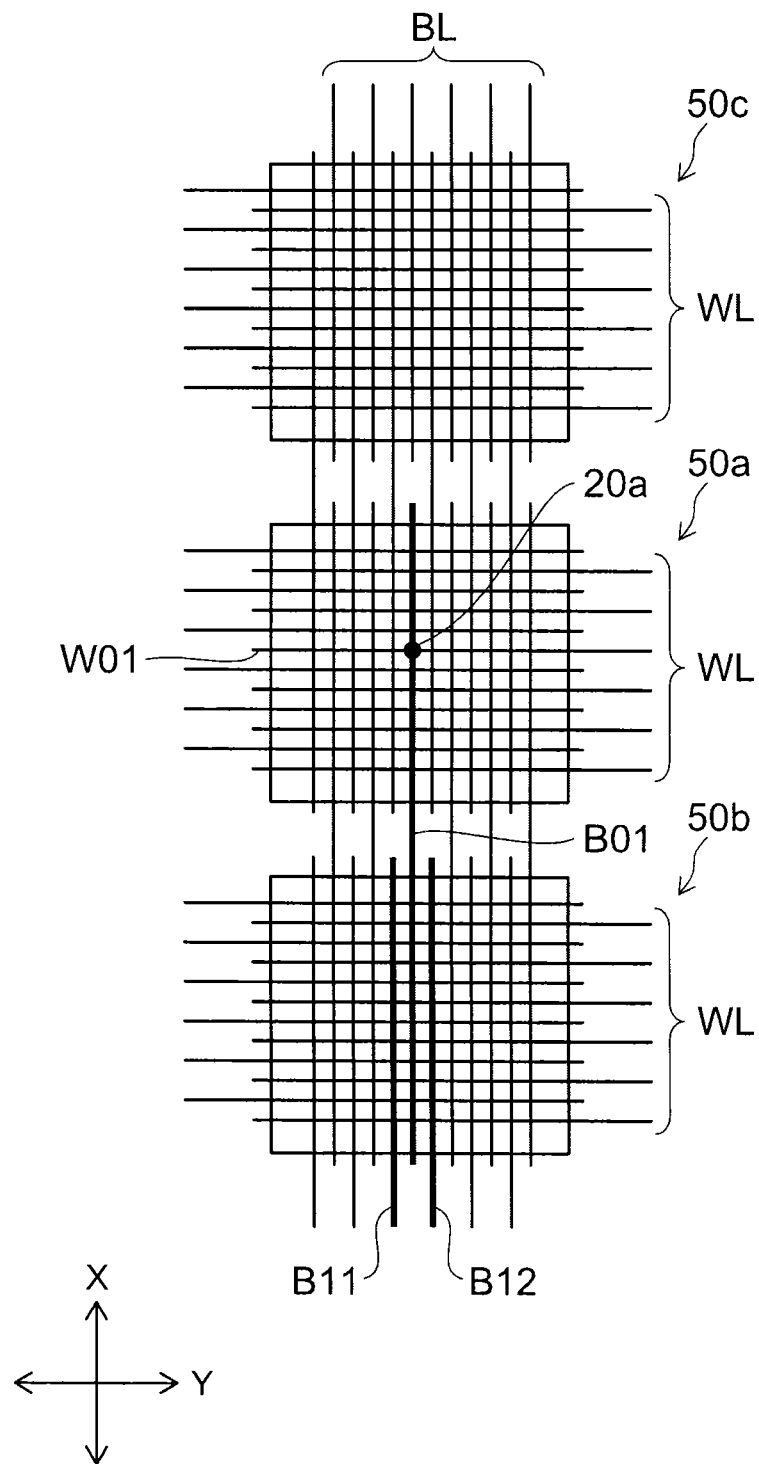
FIG. 5 is a schematic plan view for explaining a first embodiment of the operation of the semiconductor memory device.

FIG. 5 is a schematic plan view for explaining a first embodiment of the operation of the semiconductor memory device.

In FIG. 5, a selected cell 20*a* of the writing target (set operation target) is schematically represented by a black circle. The selected cell 20*a* is provided at a cross point of a selected bit line B01 and a selected word line W01.

A cell array block including the selected cell 20*a* is referred to as a selected cell array block 50*a*. Further, in FIG. 5, for example, two adjacent cell array blocks 50*b* and 50*c* which are adjacent to the selected cell array block 50*a* in the first direction X are shown. The adjacent cell array block 50*b* is adjacent to the selected cell array block 50*a* in the lower part of FIG. 5 and the adjacent cell array block 50*c* is adjacent to the selected cell array block 50*a* in the upper part of FIG. 5.

A bit line BL shared between the selected cell array block 50*a* and the adjacent cell array block 50*c* and a bit line BL shared between the selected cell array block 50*a* and the adjacent cell array block 50*b* are alternately arranged, for example, in the second direction Y.

An electric potential of 0 volt is applied to the selected bit line B01 and a first electric potential VPGM which is a positive electric potential higher than 0 volt is applied to the selected word line W01. By doing this, the resistance variable film 12 of the selected cell 20*a* may be changed from the high resistance state (reset status) into the low resistance state (set status).

In this case, a second electric potential (for example, VPGM/2) which is higher than 0 volt and lower than the first electric potential VPGM is applied to the non-selected bit line and the non-selected word line, and an operating voltage is not applied to the resistance variable film 12 of the non-selected cell by a rectifying property of the non-ohmic element 14 such as a diode. Therefore, the writing operation (set operation) is not performed on the non-selected cell.

Here, in case of a configuration in which a bit line is shared between adjacent cell array blocks, there may be the following problems.

For example, in FIG. 5, in the adjacent cell array block 50*b* that shares the selected bit line B01 with the selected cell array block 50*a*, an interconnect capacitance between the selected bit line B01 and a non-selected bit line B11 which is adjacent to the selected bit line B01 or an interconnect capacitance between the selected bit line B01 and a non-selected bit line B12 which is adjacent to the selected bit line B01 may affect the writing operation. In other words, if the resistance variable film 12 of the selected cell 20*a* is in a low resistance state (set status) and the resistance is low, electric charges charged in the interconnect capacitance instantly flows in the resistance variable film 12 of the selected cell 20*a*.

Therefore, according to the embodiment, two systems are provided as a control system for the non-selected bit lines to control the non-selected bit lines B11 and B12 in other block which are adjacent to the selected bit line B01 separately from other non-selected bit lines.

Specifically, in the writing operation, electric potentials of the non-selected bit lines B11 and B12 are set to be 0 volt which is the same as an electric potential of the selected bit line B01. In other words, electric potentials of the other non-selected bit lines are increased to be a second electric potential at the time of writing operation. In contrast, the electric potentials of the non-selected bit lines B11 and B12 are not increased likes the selected bit line B01, but maintained at 0 volt during the writing operation and before and after the writing operation.

In the adjacent cell array block 50b, by equalizing the electric potentials of the adjacent selected bit line B01, the non-selected bit lines B11 and B12 (bit lines represented with bold lines in FIG. 5), it is possible to suppress the interconnect capacitance. As a result, it is possible to prevent an over-current from instantly flowing in the selected cell 20a during the writing operation. By doing this, it is possible to improve the switching durability, suppress the decrease in the writing available times and provide a high reliable semiconductor memory device.

All of word lines WL of the adjacent cell array block 50b are not selected and the second electric potential (VPGM/2) is applied to the word lines WL. Therefore, in the adjacent cell array block 50b, the writing operation (set operation) is not performed on the non-selected cells connected to the non-selected bit lines B11 and B12.

The non-selected bit lines B11 and B12 are not limited to having an equivalent potential (0 volt) to that of the selected bit line B01. If the potential difference between the non-selected bit lines B11 and B12 and the selected bit line B01 is smaller than the potential difference (VPGM/2) between the other non-selected bit lines and the selected bit line B01, the transient current caused by the interconnect capacitance may be suppressed. In other words, a three electric potential which is higher than 0 volt and lower than the second electric potential (VPGM/2) may be applied to the non-selected bit lines B11 and B12.

If the electric potentials of the non-selected bit lines B11 and B12 are set to be 0 volt, a voltage (VPGM/2) is applied to the non-selected cell between the non-selected bit lines B11 or B12 and the non-selected word lines in the adjacent cell array block 50b.

In the meantime, if an electric potential which is higher than 0 volt (but is lower than VPGM/2) is applied to the non-selected bit lines B11 and B12, a voltage which is lower than VPGM/2 is applied to the non-selected cell between the non-selected bit lines B11 or B12 and the non-selected word lines in the adjacent cell array block 50b. Therefore, erroneous set operation of the non-selected cell is prevented more certainly.

Second Embodiment

Figure 6:
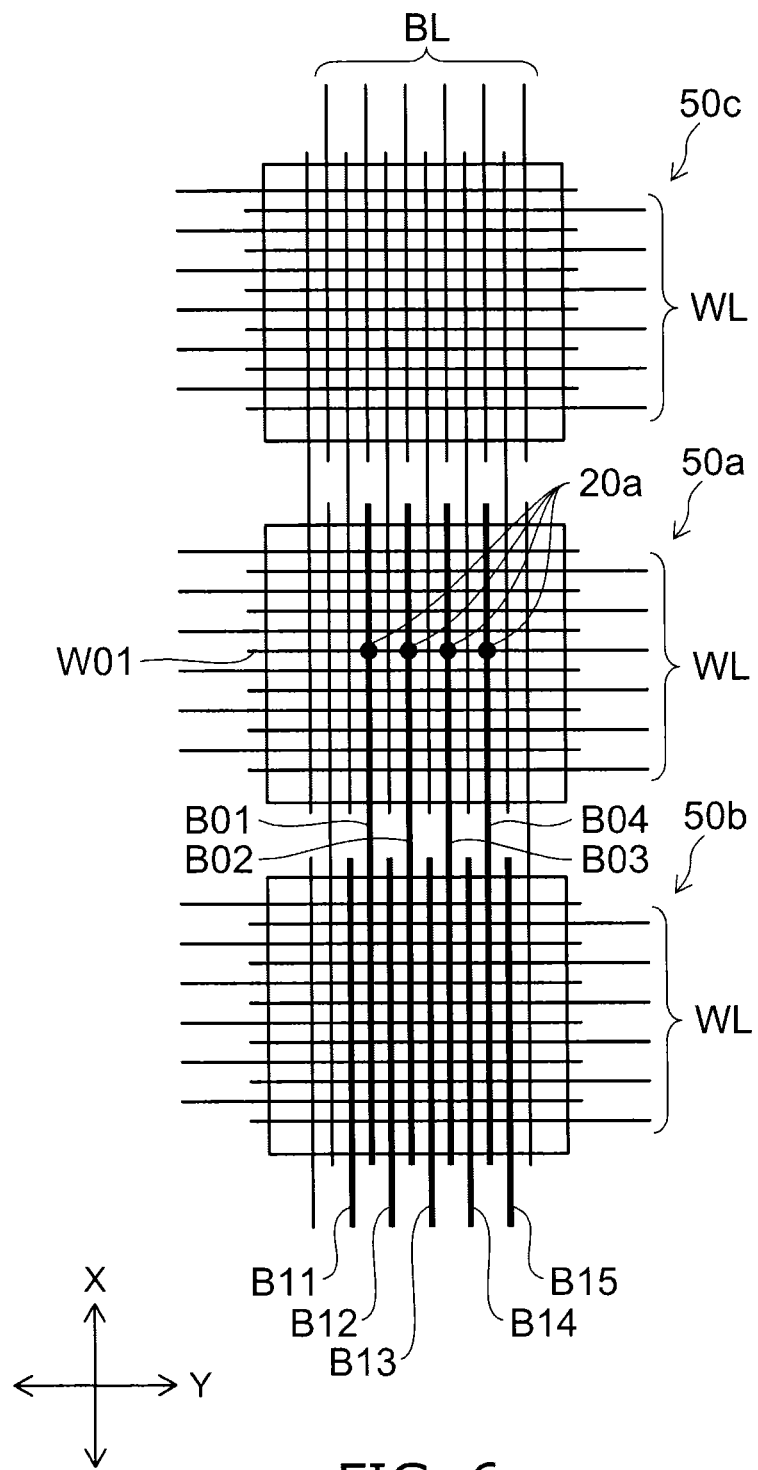
FIG. 6 is a schematic plan view for explaining a second embodiment of the operation of the semiconductor memory device.

FIG. 6 is a schematic plan view for explaining a second embodiment of the operation of the semiconductor memory device.

In the second embodiment, a plurality of selected cells 20a are simultaneously selected and operated in parallel. In FIG. 6, a selected cell 20a of the writing target (set operation target) is schematically represented by a black circle.

The selected cell 20a is provided at a cross point of a selected bit line B01 and a selected word line W01. Further, a selected cell 20a is provided at a cross point of a selected bit line B02 and the selected word line W01. A selected cell 20a is provided at a cross point of a selected bit line B03 and the selected word line W01. A selected cell 20a is provided at a cross point of a selected bit line B04 and the selected word line W01.

A cell array block including the selected cells 20a is referred to as a selected cell array block 50a. Further, in FIG. 6, for example, two adjacent cell array blocks 50b and 50c which are adjacent to the selected cell array block 50a in the first direction X are shown. The adjacent cell array block 50b is adjacent to the selected cell array block 50a in the lower part of FIG. 6 and the adjacent cell array block 50c is adjacent to the selected cell array block 50a in the upper part of FIG. 6.

A bit line BL shared between the selected cell array block 50a and the adjacent cell array block 50c and a bit line BL shared between the selected cell array block 50a and the adjacent cell array block 50b are alternately arranged, for example, in the second direction Y.

An electric potential of 0 volt is applied to the selected bit lines B01, B02, B03, and B04 and a first electric potential VPGM which is a positive electric potential higher than 0 volt is applied to the selected word line W01. By doing this, the resistance variable film 12 of the selected cell 20a may be changed from the high resistance state (reset status) into the low resistance state (set status).

In this case, a second electric potential (for example, VPGM/2) which is higher than 0 volt and lower than the first electric potential VPGM is applied to the non-selected bit line and the non-selected word line and an operating voltage is not applied to the resistance variable film 12 of the non-selected cell by a rectifying property of the non-ohmic element 14 such as a diode. Therefore, the writing operation (set operation) is not performed on the non-selected cell.

However, in the second embodiment, similarly to the first embodiment, non-selected bit lines B11, B12, B13, B14, and B15 in another block which are adjacent to the selected bit lines B01, B02, B03, and B04 are separately controlled from the other non-selected bit lines. That is, according to the second embodiment, two systems are provided as a control system for the non-selected bit lines.

Specifically, in the writing operation, electric potentials of the non-selected bit lines B11, B12, B13, B14, and B15 are set to be 0 volt which is the same as those of the selected bit lines B01, B02, B03, and B04. In other words, an electric potential of other non-selected bit lines is increased to be a second electric potential at the time of writing operation. In contrast, the electric potential of the non-selected bit lines B11, B12, B13, B14, and B15 is not increased likes the selected bit lines B01 B02, B03, and B04, but maintained at 0 volt during the writing operation and before and after the writing operation.

In the adjacent cell array block 50b, by equalizing the electric potentials of adjacent selected bit lines B01, B02, B03, and B04, non-selected bit lines B11, B12, B13, B14, and B15 (bit lines represented with bold lines in FIG. 6), it is possible to suppress the interconnect capacitance thereof. As a result, it is possible to prevent an over-current from instantly flowing in the selected cell 20a during the writing operation. By doing this, it is possible to improve the switching durability, suppress the decrease in the writing available times and provide a high reliable semiconductor memory device.

All of word lines WL of the adjacent cell array block 50b are not selected and the second electric potential (VPGM/2) is applied to the word lines WL. Therefore, in the adjacent cell array block 50b, the writing operation (set operation) is not performed on the non-selected cells connected to the non-selected bit lines B11, B12, B13, B14, and B15.

Further, in the second embodiment, the electric potentials of the non-selected bit lines B11, B12, B13, B14, and B15 are not limited to an equivalent potential (0 volt) to those of the selected bit lines B01, B02, B03, and B04. If the non-selected bit lines B11, B12, B13, B14, and B15 are controlled to have a third voltage that is higher than 0 volt and lower than the second electric potential (VPGM/2), it is possible to suppress a transient current caused by the interconnect capacitance.

Third Embodiment

Figure 7:
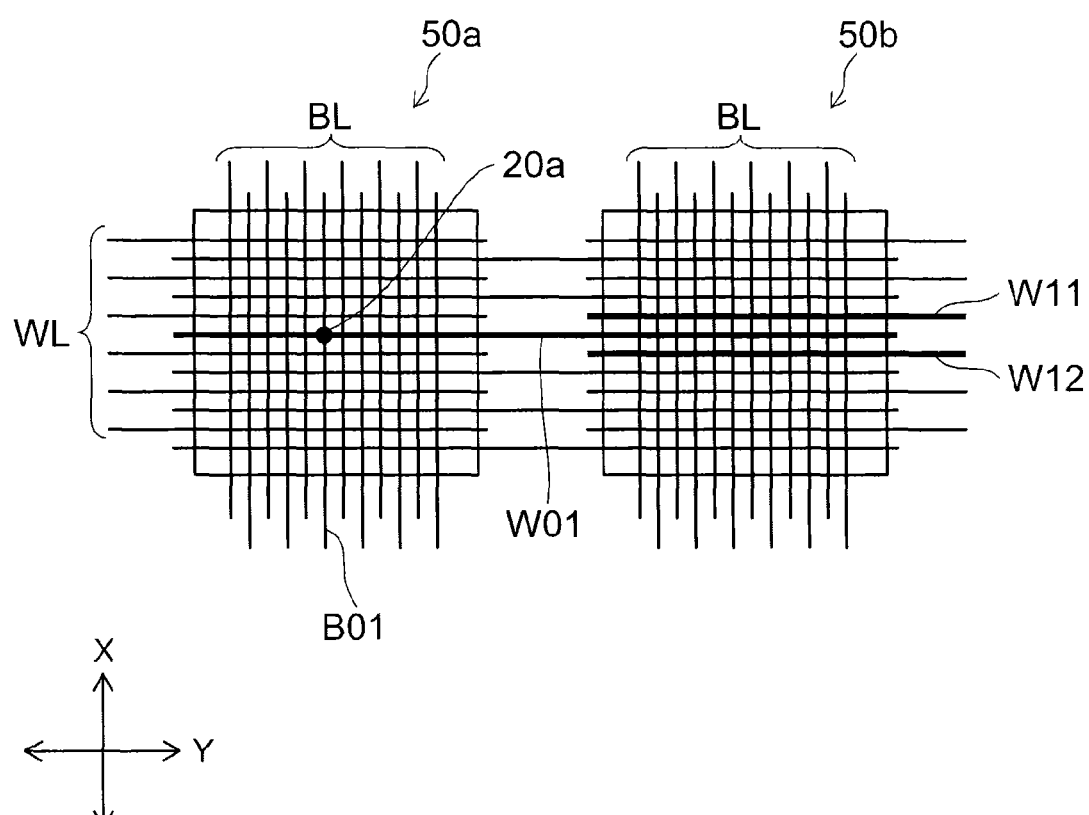
FIG. 7 is a schematic plan view for explaining a third embodiment of the operation of the semiconductor memory device.

FIG. 7 is a schematic plan view for explaining a third embodiment of the operation of the semiconductor memory device.

In FIG. 7, a selected cell 20a of the writing target (set operation target) is schematically represented by a black circle. The selected cell 20a is provided at a cross point of a selected bit line B01 and a selected word line W01.

A cell array block including the selected cell 20a is referred to as a selected cell array block 50a. Further, in FIG. 7, an adjacent cell array block 50b which is adjacent to the selected cell array block 50a in the second direction Y is shown.

The above-described first and second embodiments are applied to a so-called bipolar operation that changes the resistance status by applying a voltage having a reverse polarity to the resistance variable film 12. In contrast, the third embodiment is applied to a so-called unipolar operation that changes the resistance status of the resistance variable film 12 by controlling an amount of a voltage that is applied to the resistance variable film 12 and an applying time.

In the unipolar operation, an electric potential of 0 volt is applied to the selected word line W01 and a positive electric potential which is higher than 0 volt, that is, a first electric potential VPGM is applied to the selected bit line B01. By doing this, the resistance variable film 12 of the selected cell 20a may be changed from the high resistance state (reset status) into a low resistance state (set status).

In this case, 0 volt is applied to the non-selected bit line and the first electric potential VPGM is applied to the non-selected word line, but an operating voltage is not applied to the resistance variable film 12 of the non-selected cell by a rectifying property of the non-ohmic element 14 such as a diode. Therefore, the writing operation (set operation) is not performed on the non-selected cell.

However, in the third embodiment, two systems are provided as a control system for the non-selected word lines. The non-selected word lines W11 and W12 in another block which are adjacent to the selected word line W01 are separately controlled from the other non-selected word lines.

Specifically, in the writing operation, electric potentials of the non-selected word lines W11 and W12 are set to be 0 volt which is the same as that of the selected word line W01. In other words, electric potentials of another non-selected word lines is increased to be a first electric potential at the time of writing operation. In contrast, the electric potential of the non-selected word lines W11 and W12 is not increased likes the selected word line W01, but maintained at 0 volt during the writing operation and before and after the writing operation.

In the adjacent cell array block 50b, by equalizing the electric potentials of the adjacent selected word line W01, the non-selected word lines W11 and W12 (word lines represented with bold lines in FIG. 7), it is possible to suppress the interconnect capacitance. As a result, it is possible to prevent an over-current from instantly flowing in the selected cell 20a during the writing operation. By doing this, it is possible to improve the switching durability, suppress the decrease in the writing available times and provide a high reliable semiconductor memory device.

All of bit lines BL of the adjacent cell array block 50b are not selected and have 0 volt. Therefore, in the adjacent cell array block 50b, the writing operation (set operation) is not performed on the non-selected cells connected to the non-selected word lines W11 and W12.

Fourth Embodiment

Figure 8:
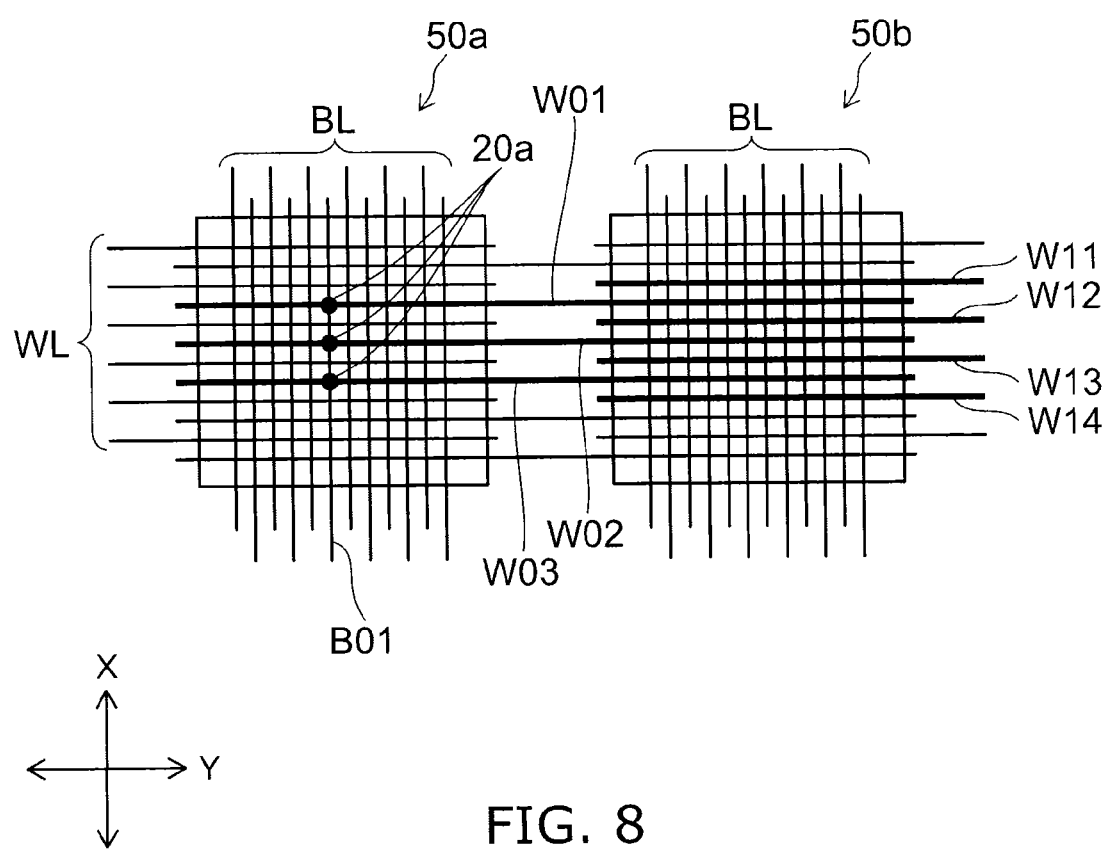
FIG. 8 is a schematic plan view for explaining a fourth embodiment of the operation of the semiconductor memory device.

FIG. 8 is a schematic plan view for explaining a fourth embodiment of the operation of the semiconductor memory device.

In the fourth embodiment, a plurality of selected cells 20a are simultaneously selected and operated in parallel. In FIG. 8, a selected cell 20a of the writing target (set operation target) is schematically represented by a black circle.

A selected cell 20a is provided at a cross point of a selected word line W01 and a selected bit line B01. Further, a selected cell 20a is provided at a cross point of a selected word line W02 and the selected bit line B01. A selected cell 20a is provided at a cross point of a selected word line W03 and the selected bit line B01.

A cell array block including the selected cell 20a is referred to as a selected cell array block 50a. Further, in FIG. 8, an adjacent cell array block 50b which is adjacent to the selected cell array block 50a in the second direction Y is shown.

The fourth embodiment is also applied to the unipolar operation. In the unipolar operation, an electric potential of 0 volt is applied to the selected word lines W01, W02, and W03. A first electric potential VPGM which is a positive electric potential higher than 0 volt is applied to the selected bit line B01. By doing this, the resistance variable film 12 of the selected cell 20a may be changed from the high resistance state (reset status) into the low resistance state (set status).

In this case, 0 volt is applied to the non-selected bit line and the first electric potential VPGM is applied to the non-selected word line but an operating voltage is not applied to the resistance variable film 12 of the non-selected cell by a rectifying property of the non-ohmic element 14 such as a diode. Therefore, the writing operation (set operation) is not performed on the non-selected cell.

However, in the fourth embodiment, similarly to the third embodiment, two systems are provided as a control system for the non-selected word lines. The non-selected word lines W11, W12, W13, and W14 in another block which are adjacent to the selected word lines W01, W02, and W03 are separately controlled from the other non-selected bit lines.

Specifically, in the writing operation, electrical potentials of the non-selected word lines W11, W12, W13, and W14 are set to be 0 volt which is the same as those of the selected word lines W01, W02, and W03. In other words, electric potentials of other non-selected word lines are increased to be a first electric potential at the time of writing operation. In contrast, the electric potential of the non-selected word lines W11, W12, W13, and W14 is not increased likes the selected word lines W01, W02, and W03, but maintained at 0 volt during the writing operation and before and after the writing operation.

In the adjacent cell array block 50b, by equalizing the electric potentials of the adjacent selected word lines W01, W02, and W03, the non-selected word lines W11, W12, W13, and W14 (word lines represented with bold lines in FIG. 8), it is possible to suppress the interconnect capacitance thereof. As a result, it is possible to prevent an over-current from instantly flowing in the selected cell 20a during the writing operation. By doing this, it is possible to improve the switching durability, suppress the decrease in the writing available times and provide a high reliable semiconductor memory device.

All of bit lines BL of the adjacent cell array block 50b are not selected and have 0 volt. Therefore, in the adjacent cell array block 50b, the writing operation (set operation) is not performed on the non-selected cells connected to the non-selected word lines W11, W12, W13, and W14.

The above-described embodiment is not limited to the writing operation (set operation) on to the selected cell, but may also be applied to the deleting operation (reset operation).

For example, in the bipolar operation shown in FIG. 5, at the time of deleting operation, the first electric potential VPGM is applied to the selected bit line B01 and the selected word line W01 is set to be 0 volt.

In this case, an operation same as the operation described with reference to FIG. 7 may be applied. That is, it is possible to suppress the interconnect capacitance thereof and prevent the transient current resulting from the interconnect capacitance from flowing in the selected cell 20a without increasing the electric potential of the selected word line W01 and the electric potential of the non-selected word lines W11 and W12 that are adjacent to the selected word line W01 in the adjacent cell array block 50b so as to be maintained at 0 volt.

In some cases, an operation in which the resistance variable film is changed from the high resistance state into the low resistance state is the deleting operation, and an operation in which the resistance variable film is changed from the low resistance state into the high resistance state is the writing operation.

In any cases, rather when the resistance variable film is changed from the low resistance state into the high resistance state, when the resistance variable film is changed from the high resistance state into the low resistance state so that the resistance of the selected cell becomes low, electric charges of the interconnect capacitor easily flow into the selected cell so that the operation of the selected cell is significantly affected.

Therefore, when the resistance variable film of the selected cell is changed from the high resistance state into the low resistance state, it is effective to control the electric potential of a selected interconnect (selected bit line or selected word line) and a non-selected interconnect (non-selected bit line or non-selected word line) adjacent to the selected interconnect line in the adjacent cell array block to be 0 volt or the third electric potential.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device, comprising:
a plurality of cell array blocks including a plurality of bit lines extending in a first direction, a plurality of word lines extending in a second direction intersecting with the first direction, and a plurality of memory cells provided between the bit lines and the word lines at crosspoints of the bit lines and the word lines and including a resistance variable film, the cell array blocks including a first cell array block, a second cell array block adjacent to the first cell array block in the first direction, a third cell array block adjacent to the first cell array block on an opposite side to the second cell array block, the bit lines including a plurality of first bit lines and a plurality of second bit lines, the first bit lines shared between the first cell array block and the second cell array block, and not shared between the first cell array block and the third cell array block, the second bit lines shared between the first cell array block and the third cell array block, and not shared between the first cell array block and the second cell array block; and
a control circuit that sets a selected bit line connected to a selected memory cell selected from the plurality of memory cells to have 0 volt, applies a first electric potential which is higher than 0 volt to a selected word line connected to the selected memory cell, applies a second electric potential which is higher than 0 volt and lower than the first electric potential to non-selected word lines other than the selected word line, applies a third electric potential which is 0 volt or more and lower than the second electric potential to a non-selected bit line adjacent to the selected bit line in an adjacent cell array block that is adjacent to the selected cell array block including the selected memory cell in the first direction and shares the selected bit line with the selected cell array block, applies the second electric potential to non-selected bit lines other than the non-selected bit line to which the third electric potential is applied, and changes a resistance status of the resistance variable film of the selected memory cell.

2. The device according to claim 1, wherein the resistance variable film in the selected memory cell connected between the selected bit line at 0 volt and the selected word line to which the first electric potential is applied is changed from a relatively high resistance state into a low resistance state.

3. The device according to claim 1, wherein the non-selected bit line adjacent to the selected bit line in the adjacent cell array block and the non-selected bit lines other than the non-selected bit line are separately controlled.

4. The device according to claim 1, wherein the bit lines are shared between the plurality of cell array blocks selected from all the cell array blocks arranged in the first direction.

5. The device according to claim 1, wherein the word lines are shared between the plurality of cell array blocks selected from all the cell array blocks arranged in the second direction.

6. A semiconductor memory device, comprising:
a plurality of cell array blocks including a plurality of bit lines extending in a first direction, a plurality of word lines extending in a second direction intersecting with the first direction, and a plurality of memory cells provided between the bit lines and the word lines at crosspoints of the bit lines and the word lines and including a resistance variable film, the cell array blocks including a first cell array block, a second cell array block adjacent to the first cell array block in the first direction, a third cell array block adjacent to the first cell array block on an opposite side to the second cell array block, the bit lines including a plurality of first bit lines and a plurality of second bit lines, the first bit lines shared between the first cell array block and the second cell array block, and not shared between the first cell array block and the third cell array block, the second bit lines shared between the first cell array block and the third cell array block, and not shared between the first cell array block and the second cell array block; and
a control circuit that sets a selected bit line connected to a selected memory cell selected from the plurality of memory cells to have 0 volt, applies a first electric potential which is higher than 0 volt to a selected word line connected to the selected memory cell, applies a second electric potential which is higher than 0 volt and lower than the first electric potential to non-selected word lines other than the selected word line, applies 0 volt to a non-selected bit line adjacent to the selected bit line in an adjacent cell array block that is adjacent to the selected cell array block including the selected memory cell in the first direction and shares the selected bit line with the selected cell array block, applies the second electric potential to non-selected bit lines other than the non-selected bit line to which 0 volt is applied, and changes a resistance status of the resistance variable film of the selected memory cell, the selected bit line and the non-selected bit lines adjacent to the selected bit line in the adjacent cell array block being maintained at 0 volt before and after the resistance status of the resistance variable film is changed.

7. The device according to claim 6, wherein the resistance variable film in the selected memory cell connected between the selected bit line at 0 volt and the selected word line to which the first electric potential is applied is changed from a relatively high resistance state into a low resistance state.

8. The device according to claim 6, wherein the non-selected bit line adjacent to the selected bit line in the adjacent cell array block and the non-selected bit lines other than the non-selected bit line are separately controlled.

9. The device according to claim 6, wherein the bit lines are shared between the plurality of cell array blocks selected from all the cell array blocks arranged in the first direction.

10. The device according to claim 6, wherein the word lines are shared between the plurality of cell array blocks selected from all the cell array blocks arranged in the second direction.

11. A semiconductor memory device, comprising:

a plurality of cell array blocks including a plurality of bit lines extending in a first direction, a plurality of word lines extending in a second direction intersecting with the first direction, and a plurality of memory cells provided between the bit lines and the word lines at crosspoints of the bit lines and the word lines and including a resistance variable film, the cell array blocks including a first cell array block, a second cell array block adjacent to the first cell array block in the second direction, a third cell array block adjacent to the first cell array block on an opposite side to the second cell array block, the word lines including a plurality of first word lines and a plurality of second word lines, the first word lines shared between the first cell array block and the second cell array block, and not shared between the first cell array block and the third cell array block, the second word lines shared between the first cell array block and the third cell array block, and not shared between the first cell array block and the second cell array block; and a control circuit that applies a first electric potential to a selected bit line connected to a selected memory cell selected from the plurality of memory cells, sets a selected word line connected to the selected memory cell to have 0 volt, sets non-selected bit lines other than the selected bit line to have 0 volt, sets a non-selected word line adjacent to the selected word line to have 0 volt in an adjacent cell array block that is adjacent to the selected cell array block including the selected memory cell in the second direction and shares the selected word line with the selected cell array block, applies the first electric potential to non-selected word lines other than the non-selected word line to which 0 volt is applied, and changes a resistance status of the resistance variable film of the selected memory cell.

12. The device according to claim 11, wherein the selected word line and the non-selected word line adjacent to the selected word line in the adjacent cell array block are maintained at 0 volt before and after the resistance status of the resistance variable film is changed.

13. The device according to claim 11, wherein the resistance variable film in the selected memory cell connected between the selected word line at 0 volt and the selected bit line to which the first electric potential is applied is changed from a relatively high resistance state into a low resistance state.

14. The device according to claim 11, wherein the non-selected word line adjacent to the selected word line in the adjacent cell array block and the non-selected word lines other than the non-selected word line are separately controlled.

15. The device according to claim 11, wherein the bit lines are shared between the plurality of cell array blocks selected from all the cell array blocks arranged in the first direction.

16. The device according to claim 11, wherein the word lines are shared between the plurality of cell array blocks selected from all the cell array blocks arranged in the second direction.

* * * * *